(12) United States Patent
Breitwisch et al.

(10) Patent No.: US 8,897,062 B2
(45) Date of Patent: Nov. 25, 2014

(54) MEMORY PROGRAMMING FOR A PHASE CHANGE MEMORY CELL

(75) Inventors: Matthew J. Breitwisch, Pound Ridge, NY (US); Roger W. Cheek, Somers, NY (US); Stefanie R. Chiras, Cedar Park, TX (US); Ibrahim M. Elfadel, Cortlandt Manor, NY (US); Michele M. Franceschini, White Plains, NY (US); John P. Karidis, Ossining, NY (US); Luis A. Lastras-Montano, Cortlandt Manor, NY (US); Thomas Mittelholzer, Zurich (CH); Mayank Sharma, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 774 days.

(21) Appl. No.: 13/150,690

(22) Filed: Jun. 1, 2011

(65) Prior Publication Data
US 2011/0228600 A1 Sep. 22, 2011

Related U.S. Application Data

(62) Division of application No. 12/391,693, filed on Feb. 24, 2009, now Pat. No. 8,023,345.

(51) Int. Cl.
*G11C 11/00* (2006.01)
*G11C 13/00* (2006.01)
*G11C 29/02* (2006.01)

(52) U.S. Cl.
CPC ............ *G11C 29/02* (2013.01); *G11C 13/0004* (2013.01); *G11C 29/021* (2013.01); *G11C 29/028* (2013.01); *G11C 13/0064* (2013.01); *G11C 2013/0092* (2013.01); *G11C 13/0069* (2013.01)
USPC ........................................... 365/163; 365/148

(58) Field of Classification Search
CPC ........... G11C 13/0069; G11C 11/5678; G11C 13/0004; G11C 13/0064; G11C 2013/0076; G11C 2013/0092; G11C 2013/008

USPC ................................................. 365/148, 163
See application file for complete search history.

(56) References Cited

U.S. PATENT DOCUMENTS 5,502,728 A 3/1996 Smith, III
5,623,436 A 4/1997 Sowards et al.
(Continued)

FOREIGN PATENT DOCUMENTS

WO WO2006064497 A2 6/2006

OTHER PUBLICATIONS

Feng Qin et al.; "Exploiting ECC-Memory for Detecting Memory Leaks and Memory Corruption during Production Runs", 11th International Symposium on High-Performance Comptuer Architecture (HPCA-Nov. 2005), pp. 12.

(Continued)

*Primary Examiner* — Vanthu Nguyen
(74) *Attorney, Agent, or Firm* — Cantor Colburn LLP

(57) ABSTRACT

Systems, methods, and devices for iteratively writing contents to memory locations are provided. A statistical model is used to determine a sequence of pulses to write desired contents to a memory location. The contents can be expressed as a resistance value in a range to store one or more bits in a memory cell. For phase change memory, an adaptive reset pulse and one or more annealing pulses are selected based on a desired resistance range. Reading the resistance value of the memory cell can provide feedback to determine adjustments in an overall pulse application strategy. The statistical model and a look up table can be used to select and modify pulses. Adaptively updating the statistical model and look up table may reduce the number of looping iterations to shift the resistance value of the memory cell into the desired resistance range.

12 Claims, 11 Drawing Sheets

(56) References Cited

U.S. PATENT DOCUMENTS

| | | |
|---|---|---|
| 5,751,993 A | 5/1998 | Ofek et al. |
| 5,818,755 A | 10/1998 | Koyanagi et al. |
| 5,860,080 A | 1/1999 | James et al. |
| 5,867,429 A | 2/1999 | Chen et al. |
| 5,912,839 A | 6/1999 | Ovshinsky et al. |
| 5,987,570 A | 11/1999 | Hayes et al. |
| 6,009,547 A | 12/1999 | Jaquette et al. |
| 6,026,464 A | 2/2000 | Cohen |
| 6,040,993 A | 3/2000 | Chen et al. |
| 6,076,183 A | 6/2000 | Espie et al. |
| 6,222,762 B1 | 4/2001 | Guterman et al. |
| 6,226,723 B1 | 5/2001 | Gustavson et al. |
| 6,292,398 B1 | 9/2001 | Pasotti et al. |
| 6,292,903 B1 | 9/2001 | Coteus et al. |
| 6,301,151 B1 | 10/2001 | Engh et al. |
| 6,370,324 B1 | 4/2002 | Kawahara et al. |
| 6,397,366 B1 | 5/2002 | Tanaka et al. |
| 6,415,363 B1 | 7/2002 | Benayoun et al. |
| 6,424,566 B1 | 7/2002 | Parker |
| 6,457,174 B1 | 9/2002 | Kuroda et al. |
| 6,473,879 B1 | 10/2002 | Ishii et al. |
| 6,522,580 B2 | 2/2003 | Chen et al. |
| 6,570,784 B2 | 5/2003 | Lowrey |
| 6,728,826 B2 | 4/2004 | Kaki et al. |
| 6,748,561 B2 | 6/2004 | Prasad |
| 6,816,413 B2 | 11/2004 | Tanzawa |
| 6,870,773 B2 | 3/2005 | Noguchi et al. |
| 6,937,522 B2 | 8/2005 | Funaki |
| 6,970,382 B2 | 11/2005 | Toros et al. |
| 7,031,181 B1 | 4/2006 | Happ |
| 7,073,012 B2 | 7/2006 | Lee |
| 7,103,812 B1 | 9/2006 | Thompson et al. |
| 7,127,004 B1 | 10/2006 | Sonning et al. |
| 7,177,199 B2 | 2/2007 | Chen et al. |
| 7,180,771 B2 | 2/2007 | Cho et al. |
| 7,203,886 B2 | 4/2007 | Brown et al. |
| 7,292,466 B2 | 11/2007 | Nirschl |
| 7,301,817 B2 | 11/2007 | Li et al. |
| 7,305,596 B2 | 12/2007 | Noda et al. |
| 7,313,016 B2 | 12/2007 | Dodge et al. |
| 7,327,609 B2 | 2/2008 | Kim et al. |
| 7,352,624 B2 | 4/2008 | Roohparvar |
| 7,352,627 B2 | 4/2008 | Cohen |
| 7,355,237 B2 | 4/2008 | Lutze et al. |
| 7,362,615 B2 | 4/2008 | Pham et al. |
| 7,372,725 B2 | 5/2008 | Philipp et al. |
| 7,391,642 B2 | 6/2008 | Gordon et al. |
| 7,397,698 B2 | 7/2008 | Fong et al. |
| 7,430,639 B1 | 9/2008 | Bali et al. |
| 7,436,703 B2 | 10/2008 | Pham et al. |
| 7,440,315 B2 | 10/2008 | Lung |
| 7,447,948 B2 | 11/2008 | Galbi et al. |
| 7,471,559 B2 | 12/2008 | Shibata |
| 7,480,176 B2 | 1/2009 | Kamei |
| 7,488,968 B2 | 2/2009 | Lee |
| 7,542,336 B2 | 6/2009 | Han |
| 7,593,255 B2 * | 9/2009 | Happ et al. .................. 365/163 |
| 7,606,077 B2 | 10/2009 | Li et al. |
| 2002/0099996 A1 | 7/2002 | Demura et al. |
| 2003/0163776 A1 | 8/2003 | Prasad |
| 2004/0153902 A1 | 8/2004 | Machado et al. |
| 2005/0138276 A1 | 6/2005 | Navada et al. |
| 2005/0166006 A1 | 7/2005 | Talbot et al. |
| 2005/0190609 A1 | 9/2005 | Janssen et al. |
| 2005/0240745 A1 | 10/2005 | Lyer et al. |
| 2005/0251621 A1 | 11/2005 | Theis |
| 2006/0015780 A1 | 1/2006 | Fong |
| 2006/0090051 A1 | 4/2006 | Speier et al. |
| 2006/0155791 A1 | 7/2006 | Tene et al. |
| 2006/0179400 A1 | 8/2006 | Qian et al. |
| 2007/0153579 A1 | 7/2007 | Roohparvar et al. |
| 2007/0189065 A1 | 8/2007 | Suh et al. |
| 2008/0010581 A1 | 1/2008 | Alrod et al. |
| 2008/0025080 A1 | 1/2008 | Chan et al. |
| 2008/0034272 A1 | 2/2008 | Wu et al. |
| 2008/0052424 A1 | 2/2008 | Sameshima et al. |
| 2008/0114947 A1 | 5/2008 | Brox et al. |
| 2008/0151613 A1 | 6/2008 | Chao et al. |
| 2008/0158959 A1 | 7/2008 | Mokhlesi |
| 2008/0162858 A1 | 7/2008 | Moyer |
| 2008/0222368 A1 | 9/2008 | Gehrmann |
| 2008/0222491 A1 | 9/2008 | Lee et al. |
| 2008/0266991 A1 | 10/2008 | Lee et al. |
| 2008/0282106 A1 | 11/2008 | Shalvi et al. |
| 2009/0003044 A1 | 1/2009 | Happ et al. |
| 2009/0034324 A1 | 2/2009 | Kim et al. |
| 2009/0157994 A1 | 6/2009 | Hampel et al. |
| 2010/0020620 A1 | 1/2010 | Kim et al. |
| 2010/0034022 A1 | 2/2010 | Dutta et al. |
| 2010/0036997 A1 | 2/2010 | Brewer et al. |
| 2010/0125701 A1 | 5/2010 | Park |
| 2010/0165730 A1 | 7/2010 | Sommer et al. |
| 2010/0202198 A1 | 8/2010 | Kim et al. |
| 2010/0223530 A1 | 9/2010 | Son et al. |
| 2010/0241929 A1 | 9/2010 | Song et al. |
| 2011/0145504 A1 | 6/2011 | Anh et al. |
| 2011/0154160 A1 | 6/2011 | Yurzola et al. |
| 2011/0216586 A1 | 9/2011 | Graef et al. |

OTHER PUBLICATIONS

G. Novark et al.; "Exterminator: Automatically Correcting Memory Errors with High Probability"; PLDI'07; Jun. 11-13, 2007; San Diego, CA; Copyright 2007; 11 pages.

Ki-Tae Park et al., "A Zeroing Cell-to-Cell Interference Page Architecture with Temporary LSB Storing and Parallel MSB Program Scheme for MLC NAND Flash Memories,"IEEE Journal of Solid-State Circuits, vol. 43, No. 4, Apr. 2008, pp. 919-928.

Noboru Shibata et al., "A 70 nm 16 Gb 1-Level-Cell NAND Flash Memory", IEEEJournal of Solid-State Circuits, vol. 43, No. 4, Apr. 2008, pp. 929-937.

* cited by examiner

MEMORY PROGRAMMING FOR A PHASE CHANGE MEMORY CELL

CROSS-REFERENCE TO RELATED APPLICATION

This application is a divisional of U.S. patent application Ser. No. 12/391,693, filed Feb. 24, 2009, the disclosure of which is incorporated by reference herein in its entirety.

BACKGROUND

This invention relates generally to computer memory, and more specifically to programming techniques for writing to computer memory.

Memory technologies, such as flash memory and phase change memory (PCM), can have relatively long programming times relative to their respective read times. Flash memory may modulate a charge stored within a gate of a metal-oxide-semiconductor (MOS) transistor to shift the transistor's threshold voltage higher or lower per memory cell. PCM may use the different electrical characteristics of crystalline and amorphous states of chalcogenide material to store different data states per memory cell. Storing multiple bits per memory cell can present additional challenges to ensure accuracy of the stored data. For example, the application of a programming signal two times to the same PCM cell or to two different PCM cells does not necessarily lead to the same resistance values in the two cases. As a further example, PCM cell resistance values can change after programming, usually increasing with time. The meaning of a read resistance value therefore may change with time.

Using a basic write-and-verify approach to memory programming which includes a sequence of write and read operations as a feedback mechanism can reduce errors in the writing process. One drawback of write-and-verify techniques is that the iterative process consumes additional resources in the memory. For instance, the write bandwidth gets reduced in a manner proportional to the number of attempts it takes to store a value in the memory, with a greater number of iterations leading to reduced system performance.

SUMMARY

Exemplary embodiments include a method for iteratively writing contents to memory locations. The method includes receiving desired contents for a memory location that may be written through a plurality of write signals, desired accuracy for the memory location, and conditions on a number of iterations to the memory location. A statistical model associated with the memory location and an iterations counter are initialized. One of the write signals to be applied to the memory location is selected. The selecting is responsive to the desired contents, the desired accuracy, the iterations counter, the conditions on the number of iterations, and the statistical model. The selected write signal is applied to the memory location. The current contents of the memory location are read. It is then determined whether to continue with another iteration or to halt. The determining is responsive to the current contents of the memory location, the desired contents, the desired accuracy, the iterations counter and the conditions on the number of iterations. In response to determining to continue with an other iteration the statistical model is updated based on the desired contents, the desired accuracy, the iterations counter, the current contents of the memory location, and the statistical model. Also in response to determining to continue with an other iteration, the selecting, the applying, the reading, and the determining are performed.

A further embodiment is system for iteratively writing contents to memory locations. The system includes a write apparatus to interpret one or more write control signals, generate a write signal, and apply the write signal to store desired contents at a selected memory location. The system also includes a read apparatus to read current contents of the selected memory location. The system further includes write control circuitry in communication with the write apparatus and the read apparatus. The write control circuitry includes an iterations counter to count a number of write attempts and halt logic to determine when to stop writing. The write control circuitry also includes a statistical model block to store a statistical model of the memory location. The write control circuitry additionally includes a write signal selector to select the one or more write control signals responsive to the desired contents, a desired accuracy, the iterations counter, conditions on a number of iterations, the statistical model, and the current contents of the memory location.

An additional embodiment is method for programming a phase change memory (PCM) cell. The method includes receiving a desired resistance range for the PCM cell, the PCM cell having a state with a resistance value, and looping to determine adjustments to the resistance value of the PCM cell. The looping includes reading the resistance value of the PCM cell, and applying an annealing pulse in response to determining that the resistance value of the PCM cell is greater than the desired resistance range, or, in other words, it is greater than the greatest resistance in the range. The annealing pulse is shaped responsive to the resistance value of the PCM cell and the desired resistance range. The looping also includes applying an adjustable reset pulse to reset the state of the PCM cell in response to determining that the resistance value of the PCM cell is less than the desired resistance range. The adjustable reset pulse is shaped responsive to the desired resistance range. The looping repeats until one or more termination criteria are met. An initial instance of the adjustable reset pulse may be applied prior to the looping.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
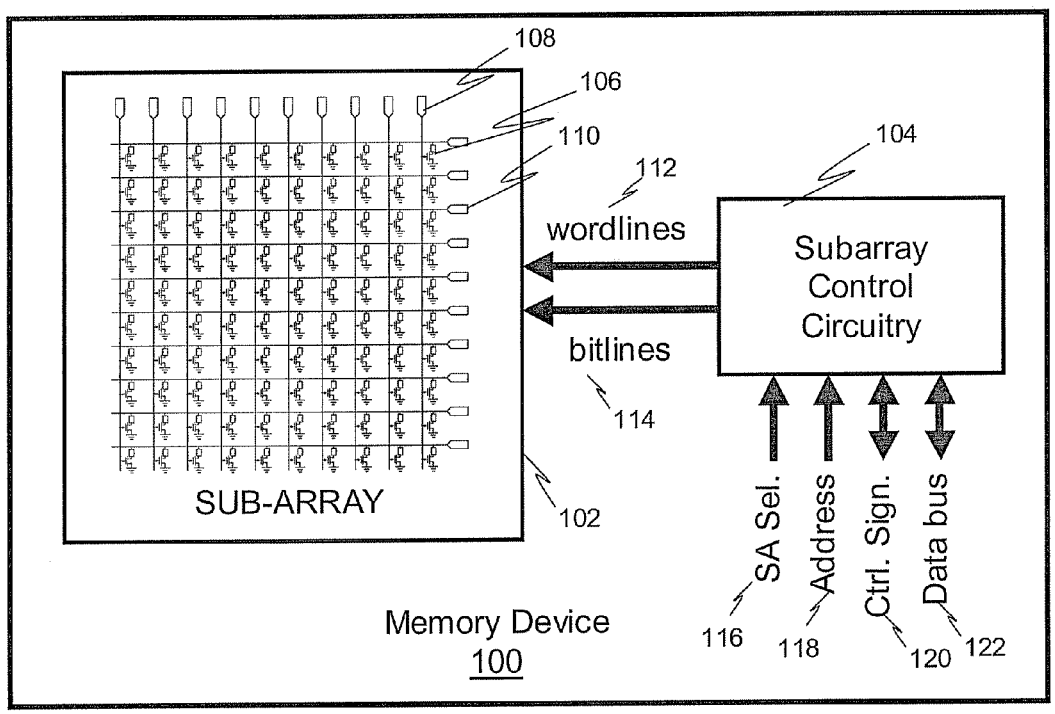
FIG. 1 illustrates an exemplary embodiment of a memory device.

An exemplary embodiment writes to a memory using an iterative write process that is responsive to a statistical model. An embodiment for phase change memory (PCM) programs a memory cell with a desired resistance range using an adjustable reset pulse for coarse precision followed by a one or more annealing pulses as a function of a read resistance value and a desired resistance range. The one or more annealing pulses may also be determined based on the statistical model, which can be updated during programming to further refine the statistical model.

Exemplary embodiments include a method and apparatus for writing to a memory that supports possible rewriting and whose input/output statistical behavior is not completely known to the writing mechanism. The method is based on a statistical model of memory locations that may be updated each time a write operation is performed. Based on the statistical model and on a set of parameters externally specified, such as a condition on the number of write operations, a signal to be written into memory locations is selected. The write process keeps iterating write operations until a stopping condition or termination criteria are met. The rules for choosing the next write signal include choosing a signal that maximizes the probability of a desired outcome given known and estimated parameters from previous write results, choosing the next write signal so as to obtain information about an unknown parameter, and choosing the write signals so as to maximize the probability of a desired outcome within a maximum number of iterations.

Exemplary embodiments are applicable to memories in which rewriting is feasible and in which the act of writing may be impaired with uncertain outcomes. Examples of this type of memories include Phase Change Memory (PCM) and flash. In PCM, when the information is read through electrical means, information is stored in the resistance value of discrete cells that are arranged in an array of cells. PCM cells have the capability of holding a range of resistance values, which makes multi-bit storage on individual cells feasible. In PCM, a desired resistance in a cell is targeted by passing current through the cell; this has the effect of heating the cell. Depending on the form of an electrical write signal, the final resistance of the PCM cell can be controlled to a certain degree. Applying the same write signal to two different cells may result in distinct resistances. Even applying the same write signal two times to the same cell may result in distinct resistances.

It is of significant interest to be able to control accurately the contents of a memory even in the presence of uncertain write outcomes. In exemplary embodiments, statistical signal processing techniques are utilized in order overcome the uncertainty of an isolated write action. Exemplary embodiments employ statistical inference of unknown parameters. Through an iterative write process which is comprised of at least one write and one read, information from previous read results is utilized along with other prior information in order to obtain estimates of unknown parameters. Exemplary embodiments are applicable to both memories in which storage is accomplished using discrete entities, referred to herein as cells, as well as memories in which storage is performed on a medium that can be regarded as a continuous medium. The iterative write process is described in relation to a memory location or group of locations, where a location may be a discrete cell or the coordinates of a physical portion of a continuous medium. Examples of memory devices (the terms "memory devices", "memories" and "chip" are used interchangeably herein) with discrete cells include PCM organized in electrically readable arrays, where individual cells are targeted using row and column addressing. Examples of memories where the storage medium is continuous include digital video discs (DVDs), compact discs (CDs), probe based storage, magnetic hard drives, etc.

For the purposes of explanation about the write process, in exemplary embodiments, the act of writing and the act of reading the contents of a memory location are coalesced into a single operation whose input/output relation is to a certain degree intrinsically random, and governed by a statistical model with potentially unknown parameters. The input is a write signal that is applied to a memory location and the output is obtained by reading the memory location using a read mechanism available for the memory.

Some parameters of the statistical model may be unique to specific memory locations and some of them may be shared by multiple memory locations. Some parameters that are shared by multiple memory locations may be stored in a manner that they can be retrieved when writing to and possibly reading from the memory. It will often be advantageous to store parameters only when they are shared by a sufficiently large number of memory locations, as their storage cost then becomes spread over the number of memory locations. Examples of groups of memory locations that can share parameters include all memory locations in a chip, all memory locations in an array or subarray within a chip, all memory locations within the same row of an array within a chip, or all memory locations within the same column of an array within a chip. The shared parameters may be stored inside of the memory chip to which the parameters pertain, or may be stored outside in memories accessible by a memory controller reading and writing to the memory chip. A memory location being written may have a statistical model that shares parameters with the statistical model of a memory location that has been written into in the recent past. For example, nearby memory locations may share parameters and also may be often written at the same time or close to the same time. In this situation, exemplary embodiments include the possibility of keeping parameters for recently written to memory cells in a manner that is accessible by a subsequent write operation.

At the time of starting a write process, each write signal is associated with an expected content for the memory location. This association is established by combining all prior information that is available for the statistical behavior of the memory locations. For example, it might be known that when a fixed current pulse is applied, an ensemble of PCM cells is associated with a distribution of resulting resistance values. The current pulse is then associated with the mean value of the distribution of resulting resistance values when it is applied to any element of the particular group of cells from which the distribution was derived. A different group of cells may have a different distribution of responses.

In a manner illustrative of the discussion above, consider the statistical model given by the equation:

$$Y_i = f(X_i) + \Theta + W_i \quad (1)$$

for i=1, 2, 3, . . . , where $X_i$ is the input to a memory location at time i, where $Y_i$ is the resulting value at the memory location, and $\Theta$ (also referred to herein as "theta") and $W_i$ are independent random variables for all i≥1, and the random variables $W_1, W_2, \ldots$ are independent as well. For the model described by equation (1), $\Theta$ is regarded as an unknown parameter of the memory location. The random variable $\Theta$ remains fixed for all iterations for a given memory location, but may be different from one memory location to the other. The role of the function $f(X_i)$ is to give, for every input signal, the expected contents for the memory location that incorporate all prior information available at the beginning of the write process, as discussed above. Thus, this function in general may be distinct for different memory locations. These random variables may be described using parametric models; for example they may be Gaussian random variables with a given variance. Some of the parameters of the models of the random variables may be not known. The model for the distribution of $\Theta$ describes how an ensemble of memory locations is expected to behave, while the model for the distribution of the $W_i$ describes the variability of an individual memory location.

The model described by equation (1) with Gaussian $\Theta$ and $W_i$, may be relevant for electrically read and written PCM cells, where $Y_i$ denotes the logarithm of the resistance in a cell, $X_i$ might refer to a particular write signal (e.g. a current pulse with a given amplitude and time duration), and $f(X_i)$ refers to the expected log resistance when the current pulse is applied to a group of cells containing the cell which is being written to. Equivalently, $Y_i$ may denote the logarithm of the current that passes through a cell when a known voltage is applied to it and $f(X_i)$ may refer to the expected value of the logarithm of the current.

An appropriate sequence of inputs to the memory location is selected so that a final output is obtained that is within a desired output to within a given accuracy. For example, a memory location may be programmed to hold one out of N values and during a write it is desired to ensure that the value of a memory location is sufficiently close to the desired value. In order to accomplish this, an iterative write procedure is utilized. In the iterative write procedure, a sequence of input signals $X_1, X_2, \ldots$ are written into the memory location resulting in outputs $Y_1, Y_2, \ldots$ respectively. The iterations stop at iteration/whenever it is detected that $|Y_I - v| < \epsilon$, where v denotes a desired value for the memory and $\epsilon$ is a desired accuracy parameter, where $(v-\epsilon, v+\epsilon)$ is the desired resistance range.

The value to be written at time i, is given by the equation:

$$X_i = g_i(v, Y_1, \ldots, Y_{(i-1)}) \quad (2)$$

where $g_i$ is a function that is selected according to one of multiple criteria. In a first criterion, the input $X_i$ may be selected in a manner such that the probability that $|Y_i - v| < \epsilon$ is maximized. This rule in general depends on previous memory location responses $Y_1, \ldots Y_{i-1}$. Mathematically, the function $g_i$ is chosen so as to maximize:

$$\text{Prob}(|Y_i - v| < \epsilon | X_i = g_i(v, y_1, \ldots, y_{(i-1)})) \quad (3)$$

where Prob( ) denotes the probability of the event described in the first argument, in this conditional to the event in the second argument to Prob( ). It must be noted that the expression in equation (3) is in no way tied to the explicit statistical model put forth in equation (1) and therefore the rule for choosing $g_i$ based on maximizing the value of equation (3) applies generally to any statistical model. The above rule shall be discussed in the context of equation (1) with Gaussian random variables in more detail.

A second criterion for the selection of $g_i$ is for the input $X_i$ to be selected in a manner so that $Y_i$ will reveal as much information about an unknown parameter as possible. Depending on the statistical model under consideration, the two criteria above may or may not coincide in their selection of $X_i$. In particular, if the goal is minimizing the average number of iterations required, selecting at each step the signal that maximizes the probability that $|Y_i - v| < \epsilon$ may not be the optimum solution. Some statistical models may require that the first few write attempts are aimed to maximize the precision of the estimate of the unknown statistical model parameters.

In order to illustrate the point above, consider a different statistical model:

$$Y_i = A f(X_i) + \Theta + W_i \quad (4)$$

The difference between the model described by equation (4) and the model described by equation (1) is an additional unknown random variable "A" that does not depend on the iteration index. In equation (4), A and $\Theta$ are thought of as unknown parameters of the memory location. Unlike the situation in model (1), due to the presence of the A random variable, the quality of the estimate of the $\Theta$ parameter depends on the particular written signal $X_i$. For example, if $X_i$ is chosen so that $f(X_i)$ is as close to zero as feasible, then the variance of the estimate of $\Theta$ is smallest. Thus, in situations in which dominates the uncertainty of the write process, it might be advantageous to devote iterations (for example, the first or the first few) to obtaining a good estimate of $\Theta$ instead of maximizing the probability of obtaining a desired content.

A general rule one might employ to choose an iteration to reveal information about an unknown parameter is to maximize an objective function based on a statistical quantity called conditional differential entropy. Unknown parameters $\Theta$ and A are being modeled as random variables; and it is assumed that the random variables $(X_1, Y_1, \Theta, A)$ have a joint probability density function; extensions of this discussion to the case one or more of these random variables are discrete valued are possible. The conditional differential entropy of parameter A given an output $Y_1$ obtained by putting in a specific input $x_1 = x_1$ is given by $$h(A | Y_1, X_1 = x_1) = -\int_{a, y_1} \text{Prob}(a, y_1, x_1) \log \text{Prob}(a | y_1, x_1) da dy_1,$$

where
Prob(a, $y_1, x_1$) denotes the joint probability density function of $(A, Y_1)$ conditional on the event $X_1 = x_1$. A property of conditional differential entropy is that the lower its value, the less uncertain the value of A given the observation $Y_1$ and the fact that the input $X_1 = x_1$ was used. Therefore, a possibility for a first iteration is to choose $x_1$ so that $x_1 = \text{argmin } h(A | Y_1, X_1 = x_1)$.

In a manner similar to the description above, upon having input the first i-1 symbols and observed their corresponding output, the i-th input may be selected according to: $x_i = \text{argmin } h(A | Y_i, Y_1 = y_1 \ldots Y_{i-1} = y_{i-1}, X_1 = x_1 \ldots X_{i-1} = x_{i-1}, X_i = x_i)$.

One may choose instead to substitute in the equations above the random variable A for another random variable or variables that are unknown in any given model; for example, in the model (4) variables $(\Theta, A)$ can be used instead.

In general, for a given iteration it may be chosen to maximize the probability of obtaining a desired value, or to minimize the conditional differential entropy of unknown parameters given values for observed quantities and the unobserved output in the iteration. In some situations some of the initial iterations may be devoted to obtaining good estimates of parameters while devoting the rest of the iterations to attempts to get a desired content for a memory location.

Conditions on the number of iterations can also be provided by exemplary embodiments. If a maximum number of iterations condition is received, then no memory location is allowed to iterate more than the maximum number of times.

Let maxite denote the maximum number of iterations that are allowed, and let L denote the random variable which indicates the time at which the iterative write process stops. This may be described as: $L=\min\{i\in\{1, \ldots, \text{maxite}\}:|Y_i-v|\leq \epsilon\}$.

In exemplary embodiments a third criterion includes selecting $g_1, g_2, g_3, \ldots, g_{(\text{maxite})}$ as to maximize the probability that $L<=\text{maxite}$. This involves solving an optimization problem. A way of solving this problem is through a technique called dynamic programming. In this technique, it is initially assumed that the values $x_1, y_1 \ldots x_{\text{maxite}-1} y_{\text{maxite}-1}$ are known. Since this is the case, one then can find the value of $x_{\text{maxite}}$ that maximizes: $\text{Prob}(|Y_{\text{maxite}}-v|<\epsilon|X_1^{\text{maxite}}=x_1^{\text{maxite}}, Y_1^{\text{maxite}-1}=y_1^{\text{maxite}-1})$.

Having found this value, one has the optimal strategy to be used in the last iteration. One then proceeds to find the optimal strategy to be used in the previous to last iteration. For this, one assumes that the values $x_1, y_1 \ldots x_{\text{maxite}-2} y_{\text{maxite}-2}$ are known, and chooses $x_{\text{maxite}-1}$ so as to maximize $\text{Prob}(|Y_{\text{maxite}}-v|<\epsilon|X_1^{\text{maxite}-1}=x_1^{\text{maxite}-1}, Y_1^{\text{maxite}-2}=y_1^{\text{maxite}-2})$ where the input $x_{\text{maxite}}$ is assumed to follow the optimality criterion found earlier once the output $Y_{\text{maxite}-1}$ is known. In this manner, by operating from the end towards the beginning, one can find a solution to overall optimization problem. It is not strictly necessary to obtain optimal solutions in order to have an operable invention; thus reduced complexity solutions that approximate the optimal may be used instead. In any of the criterions above, a mechanism for writing into a memory may rely on pre-computed tables that store information to reconstruct the $(g_i)$ functions or good approximations to them. As such, exemplary embodiments include pre-computing these tables off-line using algorithms that optimize functions according to one or more of the criteria described above.

It must be emphasized that the statistical models that can be employed by exemplary embodiments are in general arbitrary. For example, the model described by equation (2) may be generalized as: $Y_i=(A+V_i)f(X_i)+\Theta+W_i$, where the random variables in the collection $(V_i)$ are independent between themselves and also independent from $(W_i)$, $\Theta$ and A. Another model that may be utilized by exemplary embodiments is: $Y_i=f(X_i-\Theta)+W_i$ where now $\Theta\backslash$ is an offset characteristic to a memory location in a parameter describing a write signal. This parameter may be a voltage or a current value associated with a write signal for the memory location.

The criteria described above for choosing the functions $g_1, g_2, \ldots, g_{(i-1)}$ are generally applicable to any statistical model.

The description above concentrates on the process of writing to a single memory location. Exemplary embodiments are also applicable to a situation in which a group of memory locations is written. In this case, dependencies are accounted for in the way the memory locations operate through a unified statistical model for the entire group. A possible interpretation of this is that the statistical models for the memory locations share some common parameters. As a possible example, in PCM, the fabrication process could cause the memory cells to have non-uniform geometric properties, although physically adjacent cells may be very similar. This could be effectively described by a common model for groups of adjacent cells. Another possible interpretation is that the physical structure of the memory can lead to a statistical dependency of the contents written into a memory location on the write signals applied to other memory locations, an effect that is known as inter cell interference (ICI) similar to the inter-symbol interference (ISI) in the communications field.

The statistical model described by equation (1) assumes that the result of a write is not influenced by the current state. A statistical model may embed a state of the memory location, i.e., a set of parameters which depend on the previous write.

Exemplary embodiments of the statistical model account for common parameters shared by a group of memory locations. Estimates of these parameters may be stored and used for the initialization process of the statistical models of the memory locations, and updated periodically during or after the write process. A possible application is a rewritable memory system organized in cells. In this example, the memory system is made up of a number of devices, each device responsible for reading from and writing to a group of cells. Each read/write device can be described by its own set of parameters that affect all reading and writings done through the device. Storing an estimate of these parameters, shared by all cells operated through a single read/write device, may improve the functionality of the memory system.

As a simple example of a setting in which a single parameter affects a group of cells, consider the model given by: $Y_{i,j}=X_{i,j}+\Theta_j+W_{i,j}+\Gamma$, where the subindex (i,j) refers to iteration i of cell j, $\Theta_j$ denotes an offset specific to cell j, $W_{i,j}$ indicates the noise for iteration i and cell j and $\Gamma$ is an offset that is common to all cells.

A system taking advantage of exemplary embodiments described herein includes a memory subsystem. The memory subsystem includes one or more memory devices and a number of memory locations that may be accessed for reading their contents or for writing new contents. The memory locations may be accessed individually or in groups. For ease of description, the exemplary embodiments described below are directed to a single memory location being accessed. Other exemplary embodiments, as described herein, are directed to multiple memory locations being accessed as a group.

Turning now to FIG. 1, an exemplary memory device 100 is depicted that includes a subarray 102 controlled by subarray control circuitry 104. While only one subarray 102 is depicted in FIG. 1, it will be understood that multiple subarrays 102 and subarray control circuitry 104 can be included in the memory device 100. The subarray 102 includes a grid of multiple PCM cells 106 that are accessed using a combination of wordlines 108 and bitlines 110. The wordlines 108 and bitlines 110 are selected by wordline control signals 112 and bitline control signals 114 respectively, which not only select specific PCM cells 106 but may also read and write values to the PCM cells 106. The subarray control circuitry 104 receives multiple inputs to control the wordline and bitline control signals 112 and 114. In an exemplary embodiment, the subarray control circuitry 104 receives a subarray select 116 and an address 118. The subarray control circuitry 104 also can receive and drive control signals 120 and values on data bus 122.

Figure 2:
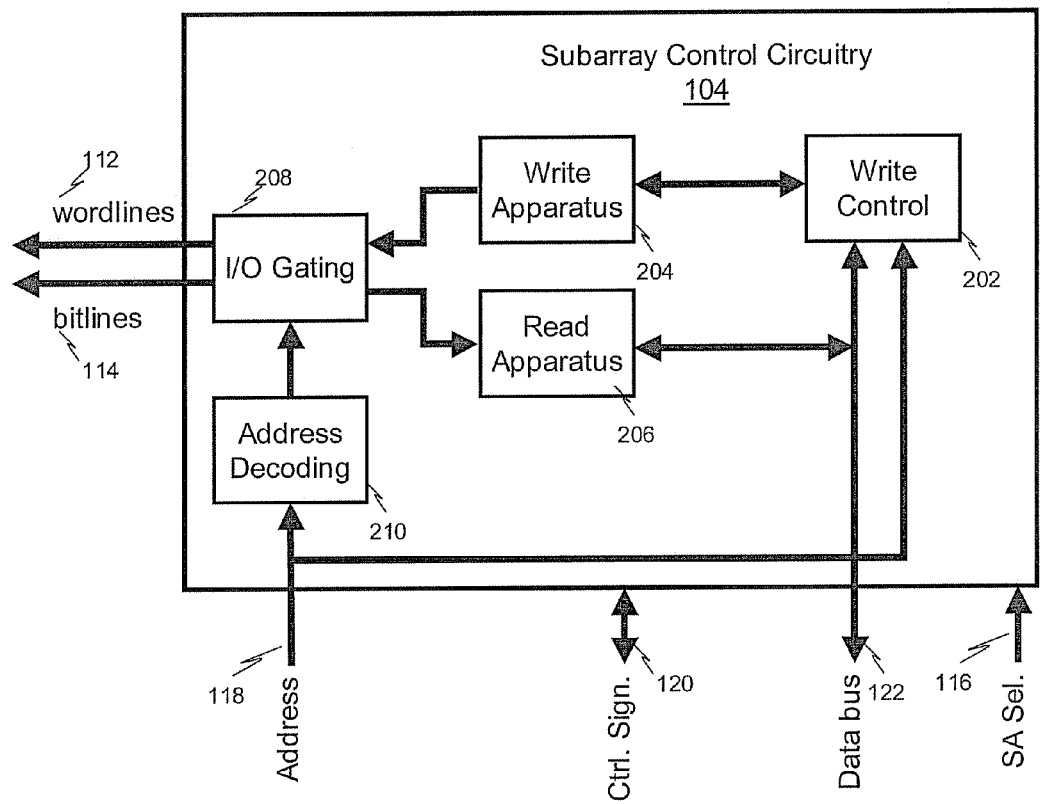
FIG. 2 illustrates an exemplary embodiment of subarray control circuitry.

FIG. 2 depicts an exemplary embodiment of the subarray control circuitry 104 of FIG. 1 in greater detail. The subarray control circuitry 104 includes write control circuitry 202, a write apparatus 204, a read apparatus 206, I/O gating 208, and address decoding 210. The write control circuitry 202 may receive an address 118 to select one or more memory locations in the subarray 102 of FIG. 1 for writing data specified on the data bus 122. The write control circuitry 202 is connected to the write apparatus 204. The write apparatus 204 includes a circuit responsible for interpreting write control signals and a circuit which, based on the write control signal, generates a corresponding write signal that is applied to the selected memory location via the I/O gating 208 to an address decoded by the address decoding 210. The I/O gating 208 can include signal buffering logic, level and format conversion compatible with the subarray 102 of FIG. 1. After the write signal is applied to the memory location, the read apparatus 206 accesses the same memory location and reads its contents via the I/O gating 208. The read apparatus 206 may receive the contents as a current and convert the current value to a resistance value and digitize the resistance value for use by the write control circuitry 202 (e.g., using an A/D converter). In similar fashion, the write apparatus 204 may receive commands to drive an adjustable reset pulse or an annealing pulse as a digital value, which is converted to an analog pulse of electrical current. The resulting value of the read is sent to the write control circuitry 202, which may use the read value to update its internal statistical model of the cell (or memory location) and to decide whether to stop the write process or to proceed with the application of another write signal or pulse.

Figure 3:
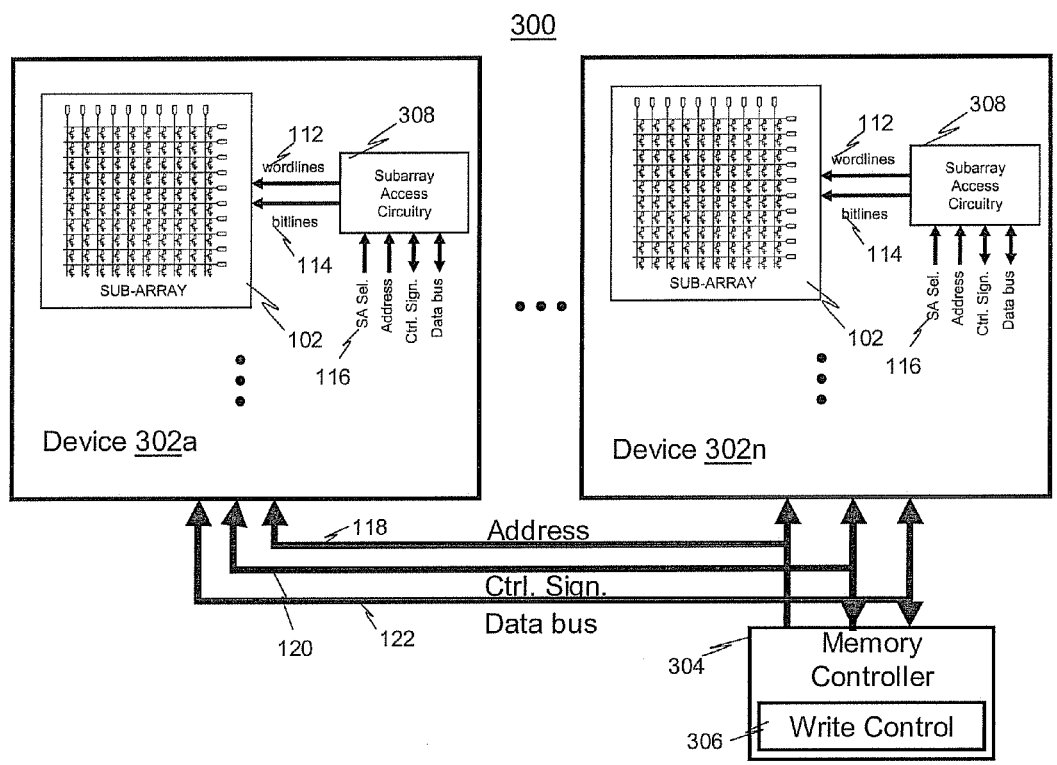
FIG. 3 illustrates an exemplary embodiment of a memory system with multiple memory devices.

FIG. 3 depicts an exemplary embodiment of a memory system 300 with multiple memory devices 302a-302n. In this embodiment, a memory controller 304 coordinates read and write activities to the memory devices 302a-302n using address 118, control signals 120, and data bus 122, which are communicated to the memory devices 302a-302n. The memory controller 304 includes a version of the write control circuitry 202 of FIG. 2, depicted as write control circuitry 306. The write control circuitry 306 performs substantially the same functions as the write control circuitry 202 of FIG. 2 but at the memory system level rather than individually distributing the logic within each of the memory devices 302a-302n. Subarray access circuitry 308 receives the address 118, control signals 120, and data bus 122 driven by the write control circuitry 306, in addition to subarray select 116 to select particular subarrays 102 within the memory devices 302a-302n.

Figure 4:
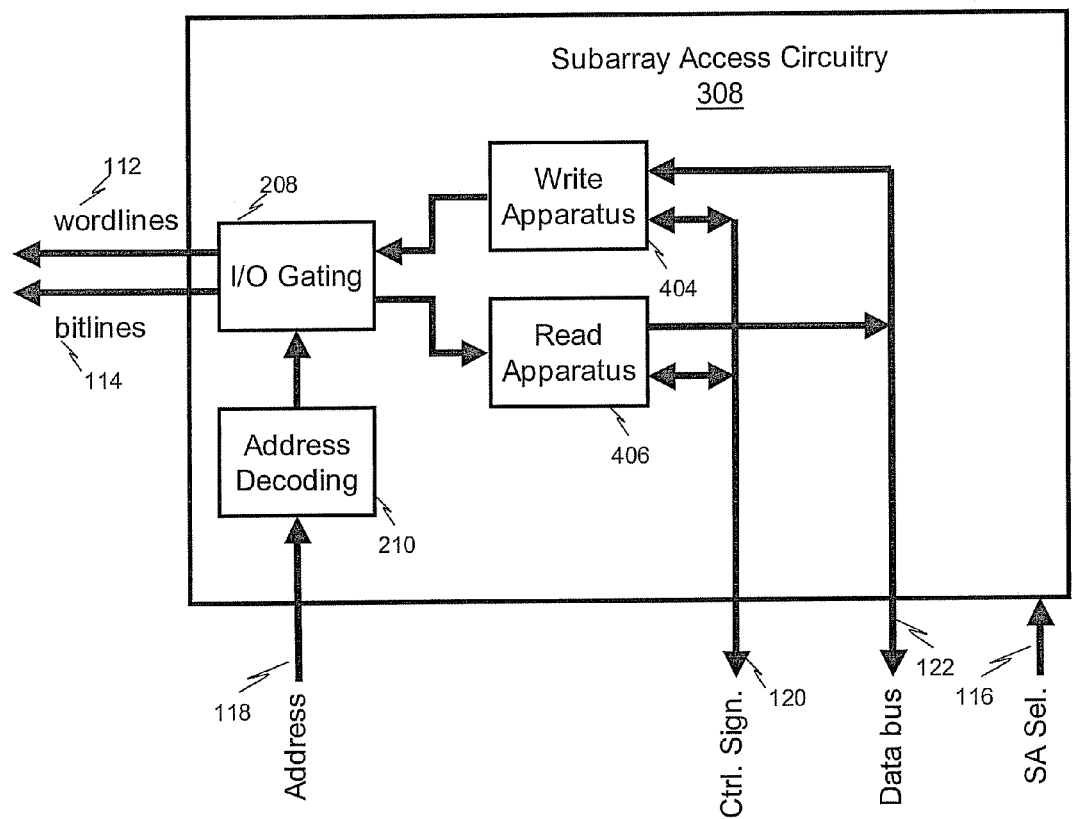
FIG. 4 illustrates an exemplary embodiment of subarray access circuitry.

FIG. 4 illustrates an exemplary embodiment of the subarray access circuitry 308 of FIG. 3. In an exemplary embodiment, the subarray access circuitry 308 includes a write apparatus 404 and a read apparatus 406. The write apparatus 404 is similar to the write apparatus 204 of FIG. 2; however, each may interface with different signals to produce the same output to the I/O gating 208. The write apparatus 404 may interface with the control signals 120 and the data bus 122 rather than directly interfacing to write control circuitry. The read apparatus 406 is also similar to the read apparatus 206 of FIG. 2, interfacing with the data bus 122 and the I/O gating 208. In alternate embodiments, the write apparatus 204 and read apparatus 206 of FIG. 2 are the same as the write apparatus 404 and read apparatus 406. The primary difference between the subarray control circuitry 104 of FIGS. 1 and 2 as compared to the subarray access circuitry 308 of FIGS. 3 and 4 is the inclusion or exclusion of write control circuitry.

Figure 5:
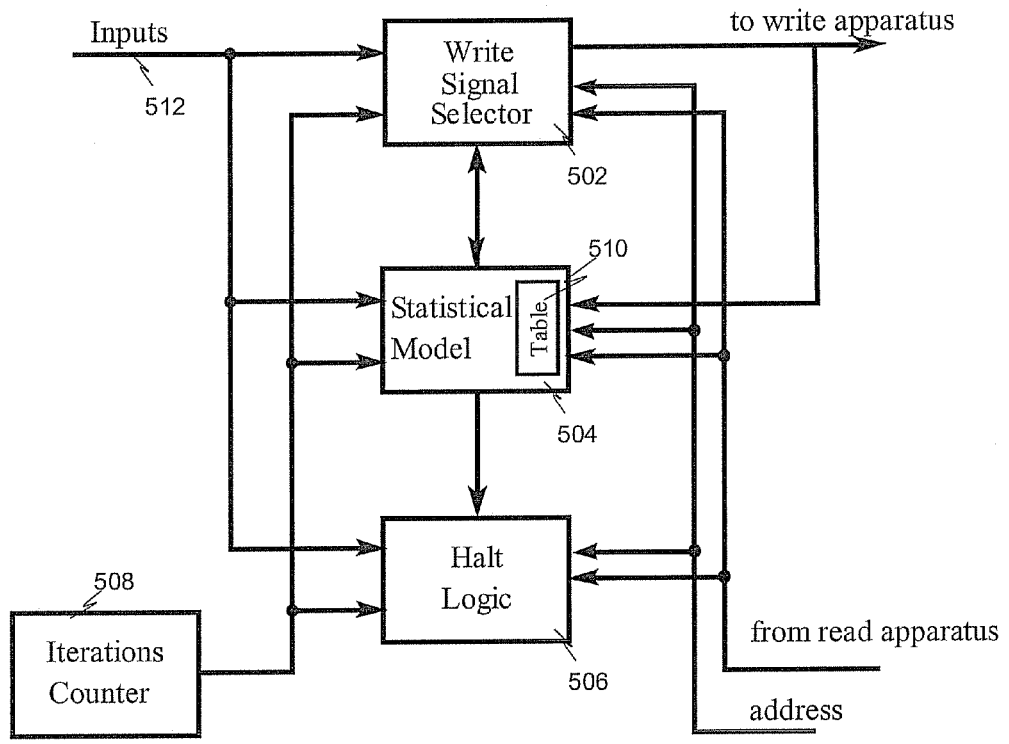
FIG. 5 illustrates an exemplary embodiment of write control circuitry.

FIG. 5 illustrates an exemplary embodiment of write control circuitry 500. The write control circuitry 500 may be implemented in the write control circuitry 204 of FIG. 2 and/or in the write control circuitry 306 of FIG. 3. The write control circuitry 500 includes a write signal selector 502 for selecting a signal specified based on the specified content to be written from inputs 512, on the desired accuracy, on the number of write operations (iterations) already made, on the memory location model and the input from the last read operation, if it is not the first write attempt. The specified content to be written can be a desired resistance range. The inputs 512 may be from the data bus 122.

The write control circuitry 500 also includes a statistical model block 504 for storing and updating a statistical model of the memory location. The statistical model is based on a priori assumptions on the memory location statistical behavior, on the previous written signals, and on the previous read values. The statistical model block 504 computes a function of the model parameters and sends it to the write signal selector 502. Before the first write attempt, the statistical model is initialized with a standard set of parameters.

Halt logic 506 is also included in the write control circuitry 500. In exemplary embodiments, the halt logic 506 emits a stop writing signal based on the current read value, on the desired content, on the desired accuracy, on the current memory location model, and on the number of iterations. For example, if a resistance value read is within the desired resistance range, then further iterations are stopped, as the desired result has been achieved. An elapsed time reaching a maximum value can be used as another termination criterion.

An iterations counter 508 of the number of completed write attempts is also included in the write control circuitry 500. The iterations counter 508 is initialized to zero whenever a write process start command is issued.

The statistical model block 504 may also include a table 510 for defining pulse characteristics. The pulse characteristics can include parameters that adjust the slope of a trailing tail of an adjustable reset pulse or the height (e.g., amplitude) of the adjustable reset pulse. The table 510 can also define characteristic parameters of a finite collection of available annealing pulses. Selecting one or more values from the table 510 may be performed by computing an index for accessing the table 510 as a function of the resistance value of the PCM cell and/or the desired resistance range. The table 510 may be updated as the statistical model is updated in the statistical model block 504.

In exemplary embodiments, the read apparatus 204 of FIGS. 2 and 404 of FIG. 4 return quantized real values to the write signal selector 502, the statistical model block 504, and the halt logic 506. The values may be in the form of resistance values. The write signal or pulse is computed as a function of a real value, "x". In exemplary embodiments, the statistical model in the statistical model block 504 (note that this is not necessarily the actual statistical behavior of the memory location) is as follows.

The read value $Y_l$ after writing a signal specified by the real quantity $x_l$ at the $l^{th}$ iteration has the statistical behavior given by the following formula: $Y_l = x_l + W_l + \theta_l$ where W is a Gaussian random variable with a mean of zero and a variance $\sigma_l^2$, where $\theta_l$ represents a write offset for the memory location.

The parameters $\theta_l$ and $\sigma_l^2$ are updated as follows: based on the current write value and the read $Y_l$ value $$\theta_{l+1} = \frac{\theta_l\left(l-1+\frac{\sigma^2}{\sigma_\theta^2}\right) + y_l - x_l}{l + \frac{\sigma^2}{\sigma_\theta^2}}$$

$$\sigma_{l+1}^2 = \sigma^2\left(1 + \frac{1}{l + \frac{\sigma^2}{\sigma_\theta^2}}\right)$$

Only the parameter $\theta_l$ is passed to the write signal selector 502. The halt logic 506 stops the writing process if $|Y_l - v| < \epsilon$, where v is the desired contents and $\epsilon$ is the accuracy parameter. The write signal selector computes the next real valued parameter $x_{l+1}$ as follows: $x_{l+1}=v-\theta_l$. This parameter as well as the desired final resistance value is employed to select a pulse to write. In particular, a function phi($x_l$) will be used to map the desired value $x_l$ into a parameter or set of parameters describing the pulse. The pulse may come from a family of pulses characterized with approximately rectangular pulses with differing heights as well as pulses with a trailing edge with variable slope. In this case, phi($x_l$) returns a height parameter or a slope for the trailing edge. To illustrate the manner in which the write selector chooses a signal, consider a family of rectangular pulses. After computing $x_l$ with a technique similar to that described above, the function phi($x_l$) is computed, e.g., using a table. The obtained parameter used to specify the height of the rectangular pulse is fed to the circuitry responsible for the generation of the rectangular pulse. In an exemplary embodiment, phi($x_l$) is generated by means of a polynomial function with coefficients tuned by standard fitting techniques applied to a standard statistical characterization of the cell array behavior, which can be obtained by applying several instances of selected programming pulses from the family of programming pulses to several cells in an array. Those skilled in the art will recognize that the present invention is not limited to polynomial models for phi( ). Other possible models for phi( ) include, and spline functions, and tables, and combinations of basic functions, and limited precision implementations of the models.

The above described technique implements a version of maximum likelihood selection of the write signal, whenever the real cell behavior is given by equation (1) where W is a Gaussian random variable with zero mean and variance $\sigma^2$, $\Theta$ is a Gaussian random variable with zero mean and variance $\sigma_\theta^2$ representing a write offset for the memory location, constant during the write process.

The halt logic 506 can also use the number of iterations from the iterations counter 508 to compute a stop condition as a termination criterion. The stop condition in this case may be to "stop if $|Y_l-v|<\epsilon$" or "stop if the iterations counter 508 is equal to M" where M is the maximum number of allowed iterations.

Figure 6:
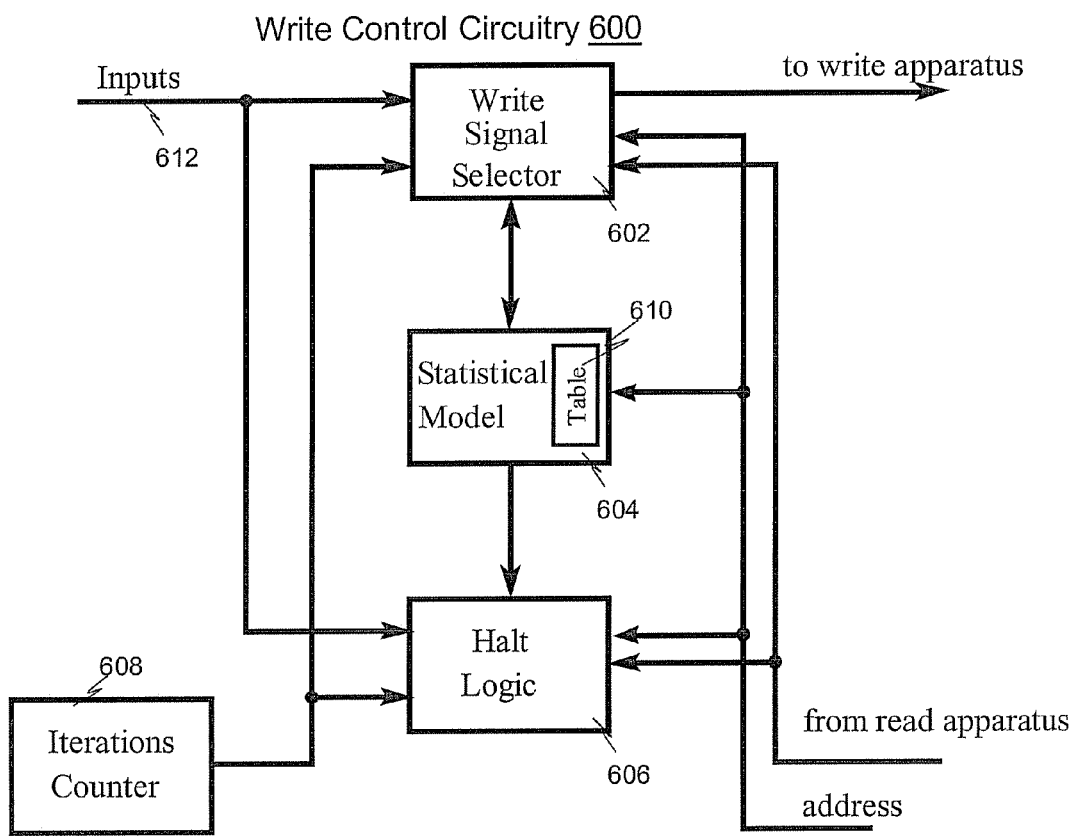
FIG. 6 illustrates another exemplary embodiment of write control circuitry.

FIG. 6 illustrates another exemplary embodiment of write control circuitry 600. Similar to the write control circuitry 500 of FIG. 5, the write control circuitry 600 includes a write signal selector 602, a statistical model block 604, halt logic 606, an iterations counter 608, a table 610 in the statistical model block 604, and inputs 612. The halt logic 606 and iterations counter 608 may be the same as the halt logic 506 and iterations counter 508 of FIG. 5. A primary difference between the write control circuitry 500 and 600 is that the statistical model and table 610 within the statistical model block 604 may be static in the write control circuitry 600, while the statistical model and table 510 within the statistical model block 504 can be adaptively updated. The absence of updating of the statistical model block 604 may simplify the implementation of the statistical model block 604 as compared to the statistical model block 504 of FIG. 5.

Figure 7:
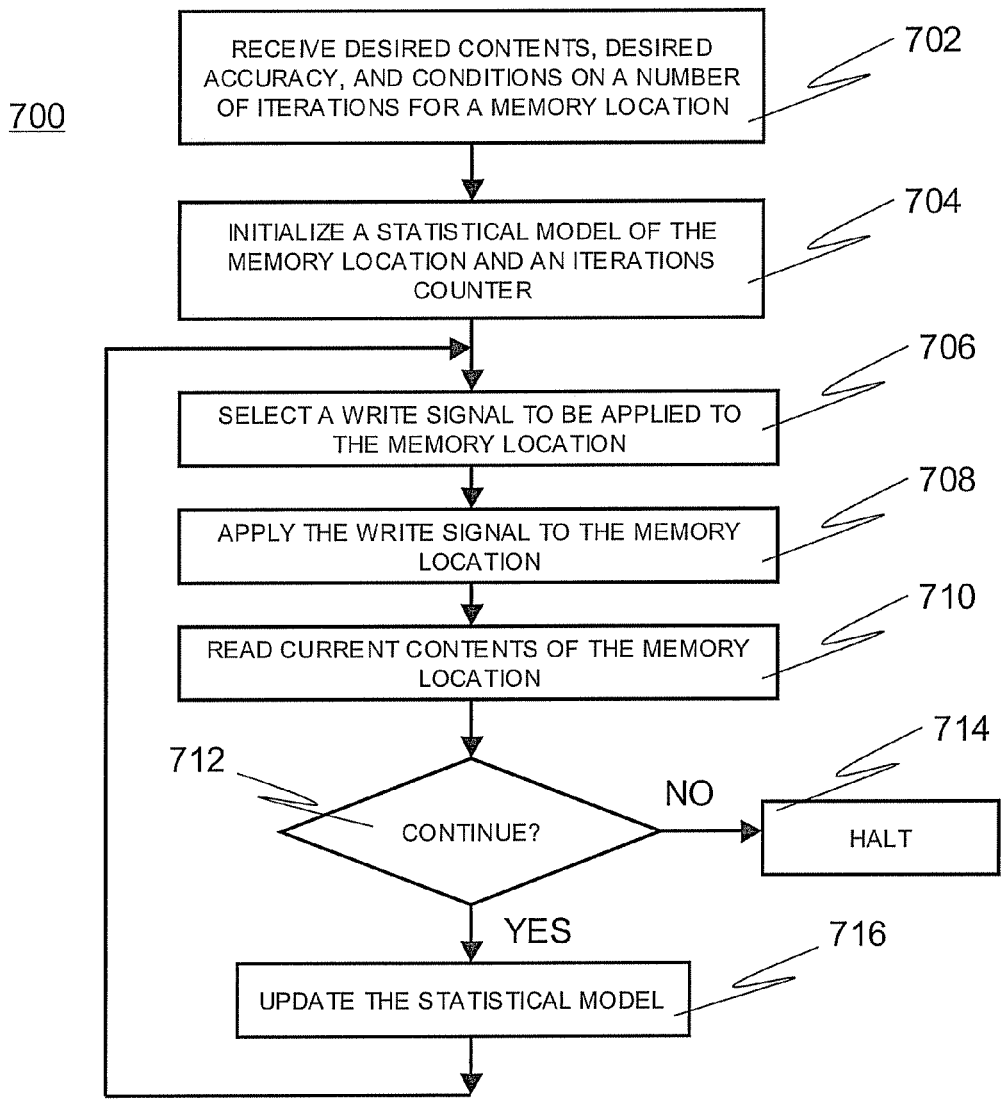
FIG. 7 illustrates a process for performing an iterative memory write that may be implemented by exemplary embodiments.

FIG. 7 illustrates a process 700 for performing an iterative memory write that may be implemented by exemplary embodiments. For purposes of explanation, the process 700 is described in reference to the write control circuitry 500 of FIG. 5. At block 702, inputs 512 are received by the write control circuitry 500. In exemplary embodiments the inputs 512 include desired contents of a memory location, desired accuracy of the memory location, and conditions on the number of write iterations for the memory location. In exemplary embodiments, the memory location is a discrete memory cell in an array of cells, such as wordlines and bitlines in the subarray 102 of FIGS. 1 and 3. In other exemplary embodiment, the memory location is a group of memory cells. In exemplary embodiments, the memory location is part of a memory constructed using PCM or flash technology, such as one or more PCM cells 106 of FIG. 1. In exemplary embodiments, the conditions on the number of iterations include at least one of a maximum number of iterations and an average number of iterations.

At block 704, a statistical model located in the statistical model block 504 is initialized. The statistical model is associated with the memory location. In addition, the iterations counter 508 is initialized to zero. In exemplary embodiments, the statistical model describes the probability of obtaining the desired memory contents given an applied write signal, which may include a sequence of pulses. The pulses can be an adjustable reset pulse and one or more annealing pulses. In exemplary embodiments, the initialization of the statistical model uses previously stored parameters that relate to the memory position. In exemplary embodiments, the statistical model associated with the memory location shares parameters with the statistical model associated with another memory location. In exemplary embodiments, the statistical model describes random variables that are jointly Gaussian.

At block 706, a write signal to be applied to the memory location is selected (by the write signal selector 502) based on the desired contents, the desired accuracy, the iterations counter, the conditions on the number of iterations, and the statistical model. In exemplary embodiments, the write signal is selected to maximize the probability of obtaining the desired memory contents given an applied write signal. In exemplary embodiments, the write signal is selected to enhance the quality of the statistical model associated with the memory location. In exemplary embodiments, the memory location can hold a plurality of distinct values and the selecting of the write signal targets one of the distinct values. In exemplary embodiments, a number, "N", of initial iterations are performed, and during these N iterations, the write signals are selected to enhance or maximize the quality of the statistical model associated with the memory location. In exemplary embodiments, the write signal for a given iteration is selected to enhance the quality of the statistical model associated with the memory location and/or to maximize the probability of obtaining the desired contents with the desired accuracy. In exemplary embodiments, the write signal is selected by estimating unknown parameters of the memory location (e.g., using a linear estimator) and then using the estimated parameters to select a write signal that maximizes the probability of obtaining the desired contents within the desired degree of accuracy. The table 510 may also be used to select and modify one or more pulse characteristics.

At block 708, the selected write signal is applied to the memory location by write apparatus 204 or 404. At block 710, the read apparatus 206 or 406 reads the current contents of the memory location via I/O gating 208. At block 712, the halt logic 506 determines whether to continue with another iteration or to halt. In exemplary embodiments, the determining is responsive to the current contents of the memory location (e.g., current resistance value), the desired contents, the desired accuracy, the iterations counter and the conditions on the number of iterations. An elapsed time may also be used as termination criterion relative to a maximum time. In response to determining to halt, block 714 is performed. In response to determining to continue with another iteration, block 716 is performed and the statistical model is updated based on the desired contents, the desired accuracy, the iterations counter, the current contents of the memory location, and the statistical model. Processing then continues at block 706 to perform another iteration. Processing continues in this manner until it is determined by the halt logic 506 at block 712 to halt.

Figure 8:
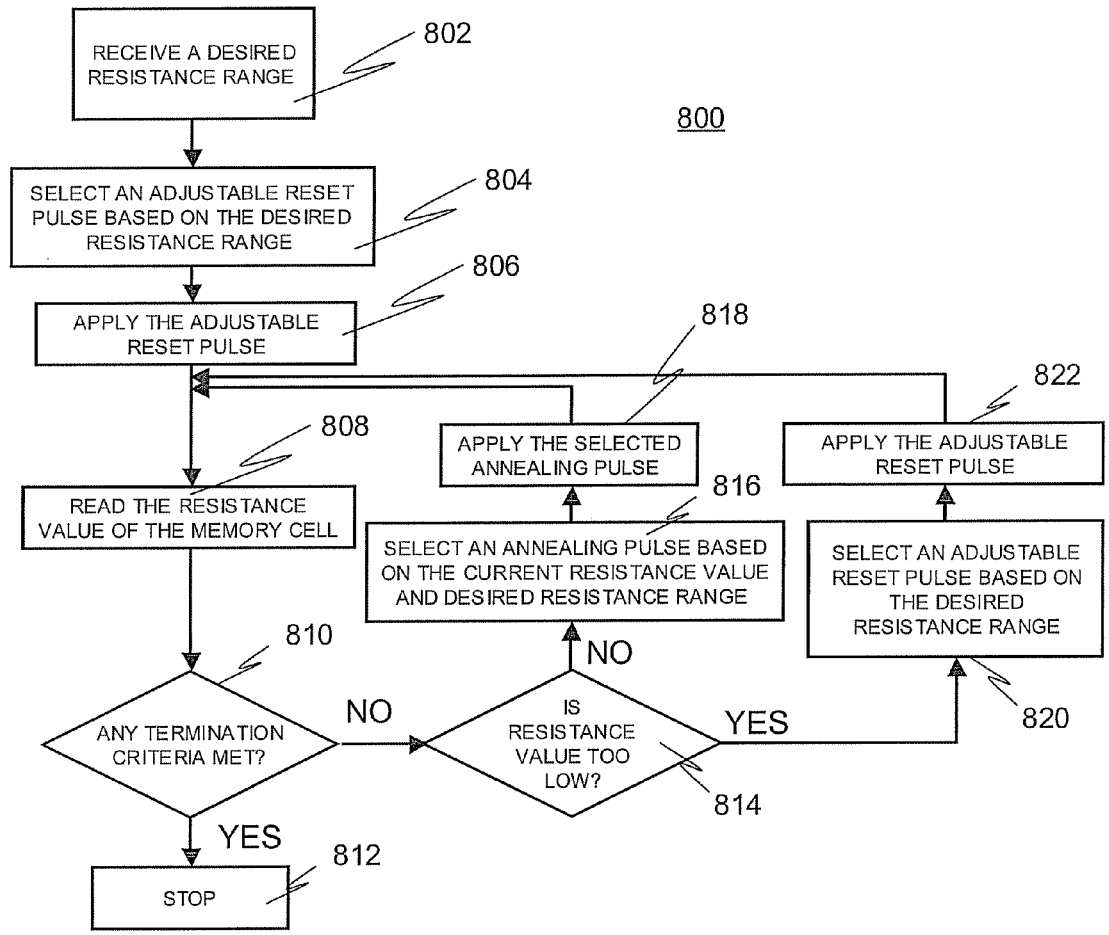
FIG. 8 illustrates a process for programming a memory cell that may be implemented by exemplary embodiments.

FIG. 8 illustrates a process 800 for programming a memory cell that may be implemented by exemplary embodiments. The process 800 may be implemented in the subarray control circuitry 104 of FIGS. 1 and 2 or in the memory system 300 of FIG. 3, among other embodiments. For purposes of explanation, the process 800 is described in reference to the write control circuitry 202 of FIG. 2 implementing an embodiment of the write control circuitry 500 of FIG. 5. At block 802, the write control circuitry 202 receives a desired resistance range. The desired resistance range may be received as inputs 512 on the data bus 122. Other values can also be accepted by the write control circuitry 202, such as precision parameter information, limits for the halt logic 506, and values supporting the statistical model and table 510 of the statistical model block 504, in addition to other values.

At block 804, the write signal selector 502 may initially select an adjustable reset pulse based on the desired resistance range. The selection can be performed using the statistical model and table 510 of the statistical model block 504 to determine various pulse characteristics that establish the shape of the adjustable reset pulse. Varying the slope of the trailing edge of the adjustable reset pulse and/or the height of the adjustable reset pulse can result in different degrees of resetting the state of a memory location in a selected PCM cell 106. For example, if the desired resistance range for the PCM cell 106 includes high resistance values, where more amorphous material is needed, then more heat may be needed as applied by electrical current of the adjustable reset pulse as compared to a partially crystalline state of PCM cell 106 associated with desired resistance ranges of intermediate resistance values. Thus, to reset the state of the PCM cell 106, a reset pulse that is equivalent to a smaller portion of a full reset pulse may be applied. An adjustable reset pulse may also be used to reduce a portion of the crystalline structure of the PCM cell 106 without fully melting to an amorphous state but raising the resistance of the PCM cell 106.

At block 806, the write signal selector 502 may drive the write apparatus 204 and the I/O gating 208 to apply the adjustable reset pulse. Digitized write signals can be converted into an analog current pulse to drive the adjustable reset pulse to the PCM cell 106 using, for instance, digital to analog conversion circuitry and signal conditioning circuitry in the write apparatus 204 and I/O gating 208. Alternatively, blocks 804 and 806 can be skipped to perform a read of the PCM cell 106 prior to selecting and applying an initial instance of the adjustable reset pulse. Looping may be performed to determine adjustments to the resistance value of the PCM cell 106.

At block 808, the read apparatus 206 reads the resistance value of the PCM cell 106 in conjunction with the I/O gating 208. The resistance value may be determined by converting a read electrical current to resistance. The read apparatus 206 provides the resistance value to the write signal selector 502 and may also provide it to the statistical model block 504 and/or the halt logic 506.

At block 810, the halt logic 506 determines whether any termination criteria have been met. The termination criteria may include determining that the resistance value of the PCM cell 106 is within the desired resistance range, using the iterations counter 508 to determine that a maximum number of looping iterations have been performed, and/or determining that a maximum time (e.g., a timeout period) has elapsed. If one or more of the termination criteria are met, then the halt logic 506 stops the process 800 at block 812. Otherwise, the looping continues at block 814.

At block 814, a check is performed as to whether the resistance value is less than the desired range value. If not, then an annealing pulse is selected at block 816 and applied at block 818. The annealing pulse may be shaped responsive to the resistance value of the PCM cell 106 and the desired resistance range. The annealing pulse may be selected among a finite collection of available pulses using values from the table 510. Shaping of the annealing pulse may also be responsive to an elapsed time between a previously applied pulse and the reading of the resistance value of the PCM cell 106. The difference or distance between the resistance value of the PCM cell 106 and the desired resistance range can also affect the shape of the annealing pulse. For example, if the PCM cell 106 is configured to store three data bits, then the PCM cell 106 supports eight states. The eight states may not have precise resistance values specified but a range of acceptable resistances per state, since it may be infeasible to achieve a precise resistance value that is repeatable. The annealing pulse shape to shift the resistance value between two higher resistance states may be different than the pulse shape to shift the resistance value between two lower resistance states. The table 510 in conjunction with the statistical model of the statistical model block 504 can account for these variations. Updating the statistical model and/or the table 510 as writes are performed may improve overall performance by reducing write times through less iteration. For instance, aging effects, environmental effects, and unknown parameters may be better handled when adaptive updating of the statistical model and/or the table 510 is performed. Additionally, a pulse strategy can be created and dynamically updated to select a sequence of pulses to converge on a resistance value of the PCM cell 106 within the desired resistance range. Similar to the adjustable reset pulse, annealing pulses are driven to the PCM cell 106 via the write apparatus 204 and the I/O gating 208.

For both the adjustable reset pulse and annealing pulse, and for potential variants, a cost can be assigned to each pulse. A statistical model for a probable outcome of applying each pulse as a function of the initial state of the PCM cell 106 can be determined using the statistical model block 504. A pulse application sequence for the PCM cell 106 that minimizes the total expected cost can be selected until one or more of the termination criteria are met, as determined by the halt logic 506. The cost of each pulse may be assigned responsive to at least one of: a duration, a current, and total energy of each pulse. Selecting the annealing pulse in the pulse application sequence may include computing an index for accessing the table 510 as a function of the resistance value of the PCM cell 106, retrieving at least one stored value in the table 510 at the computed index, and selecting the annealing pulse responsive to the desired resistance range and one or more retrieved stored values. The statistical model of the statistical model block 504 can include one or more unknown parameters. The statistical model can be updated using the resistance value of the PCM cell 106. In an exemplary embodiment, a next pulse to apply is chosen to minimize the total expected cost according to the updated statistical model until one or more of the termination criteria are met in the halt logic 506.

In response to determining that the resistance value of the PCM cell 106 is less than the desired resistance range in block 814, an adjustable reset pulse is selected in block 820 and applied in block 822. Both blocks 822 and 818 loop back to block 808 to continue the process 800 until block 812 is reached. As previously described, the adjustable reset pulse may be shaped responsive to the desired resistance range. An index associated with the desired resistance range may be used to lookup one or more adjustable reset pulse shape characteristics in the table 510. It will be understood that the process 800 can be applied to other embodiments, such as the write control circuitry 600 of FIG. 6.

Figure 9:
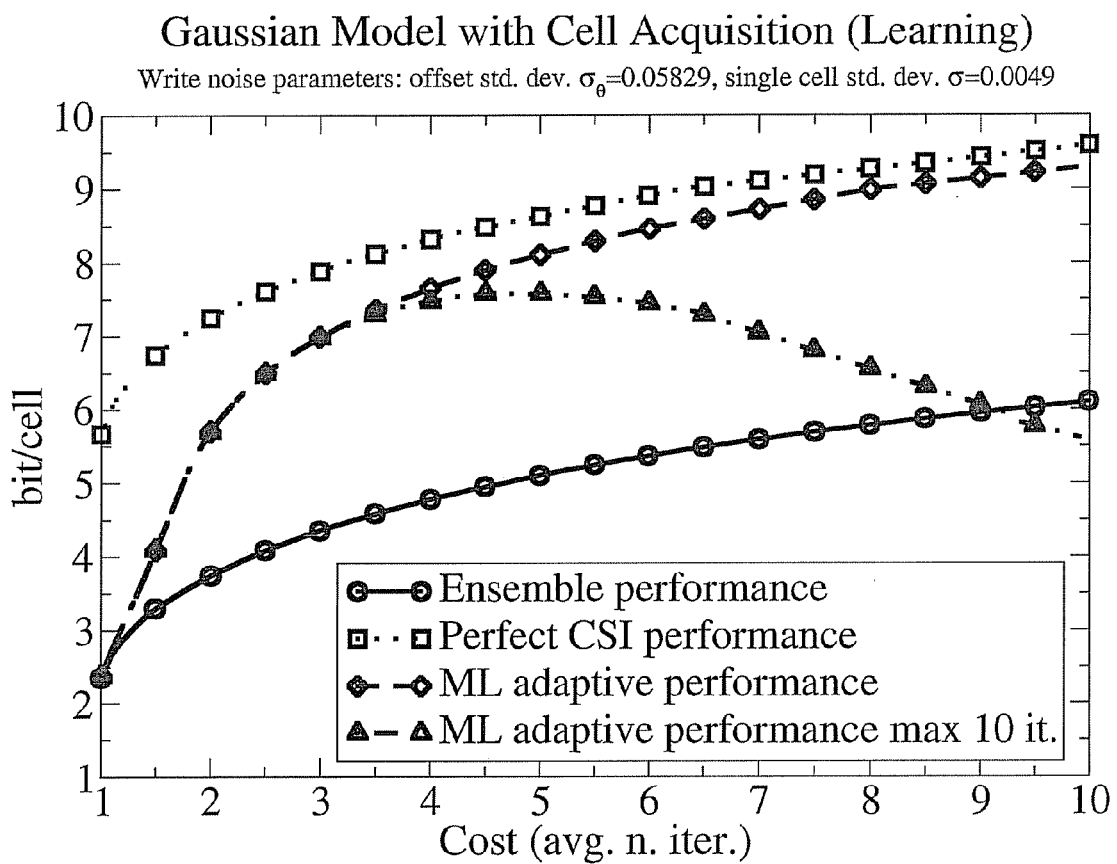
FIG. 9 illustrates a performance example applying exemplary embodiments.

FIG. 9 illustrates a performance example applying exemplary embodiments using a Gaussian model with a Gaussian offset parameter $\Theta$ as the statistical model. The various plots in FIG. 9 provide a comparative illustration of the performance measured as a lower bound on the storage capacity of the memory expressed in bits per cell. Perfect cell state information (CSI) performance refers to an array for which the offset values are known and is affected only by Gaussian write noise. Adaptive performance, and adaptive performance with a maximum of 10 iterations refer to systems which estimate cell offset using the algorithms suggested as possible embodiments. Ensemble performance refers to an array without offset and whose read noise has the magnitude of the sum of write noise plus that of offset in perfect CSI and adaptive systems. The performance in all cases is shown versus cost. The cost is the average number of iterations to reach a desired resistance range using exemplary embodiments as described herein.

Figure 10:
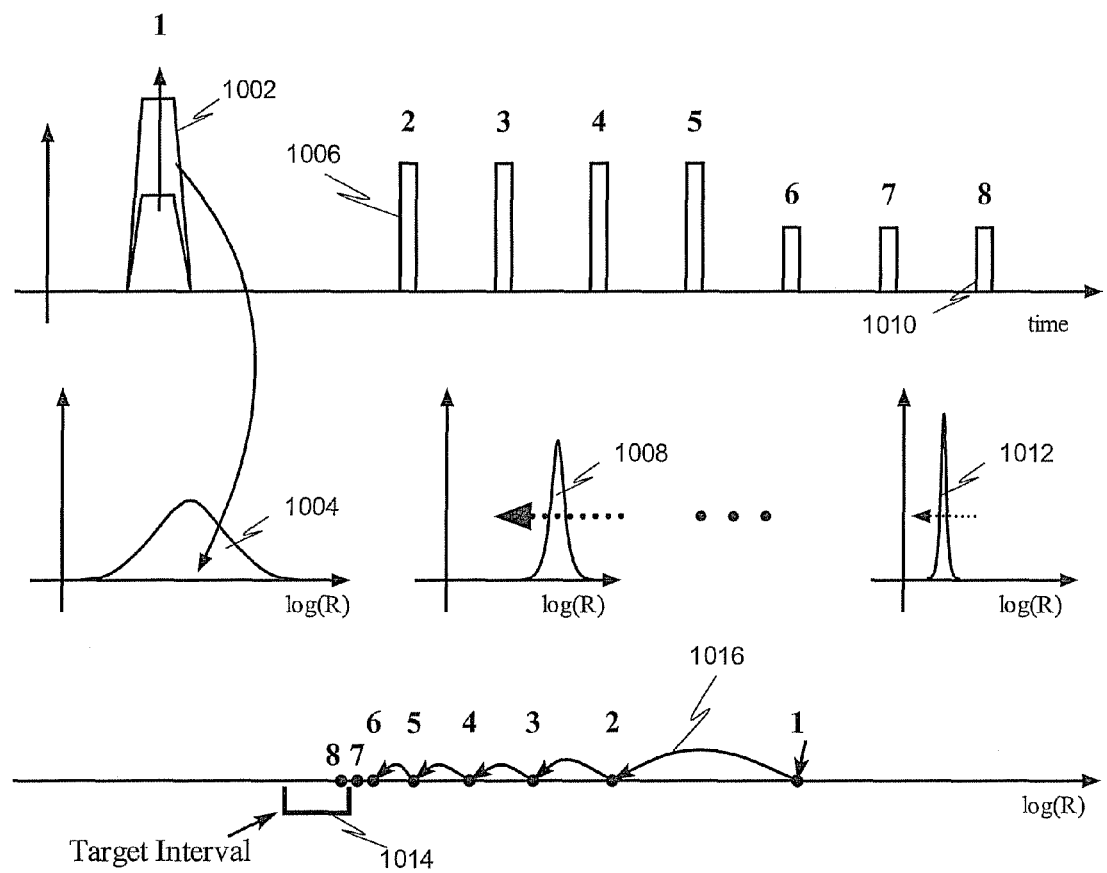
FIG. 10 depicts exemplary pulses, resistance distributions, and target range/interval.

FIG. 10 depicts exemplary pulses, resistance distributions, and target values for an adjustable reset pulse and annealing pulses that may be implemented in exemplary embodiments. An adjustable reset pulse 1002 can vary in height and slope. As the precise effect in applying the adjustable reset pulse 1002 to a PCM cell, such as one of the PCM cells 106 of FIG. 1, can vary, the adjustable reset pulse 1002 has an associated probability curve 1004 representing the probability density function of the resulting resistance value. In the example of FIG. 10, the probability curve 1004 is approximately a Gaussian distribution; however, other distributions known in the art can be used depending on the level of correlation of the modeled distribution to actual statistical behavior of the cells. FIG. 10 also illustrates a sequence of possible annealing pulses with associated probability distribution curves. For example annealing pulse 1006 has a distribution curve 1008, while annealing pulse 1010 has a distribution curve 1012. The distribution associated with an annealing pulse may depend on the shape of the annealing pulse and on the current resistance value of the cell. The distribution curves 1008 and 1012 may represent tighter probability distributions than probability curve 1004. Smaller annealing pulses such as 1010 may have tighter probability distributions than larger annealing pulses like annealing pulse 1006. Larger annealing pulses such as annealing pulse 1006 may be chosen to obtain a larger average decrease of the resistance value whereas smaller annealing pulses may be chosen to obtain smaller average decreases of the resistance value. In selecting a sequence of pulses to apply, a target interval 1014 may be reached from a sequence of target resistances 1016. A specific sequence for shifting between resistance values can vary based on the initial resistance value and the resistance values read before the application of the annealing pulses.

In exemplary embodiments, a parameter describing an annealing pulse such as the height or the width/duration is chosen to be proportional to the difference between a function of the current resistance and a function of the resistance in the desired resistance range. In exemplary embodiments, the function of the current resistance and the resistance in the resistance range is the logarithm of each resistance, respectively. In other exemplary embodiments, the function of the current resistance and the resistance in the resistance range the resistance itself, corresponding to the identity function. In exemplary embodiments, before computing the parameters defining the shape of the following annealing pulse a correction factor is applied to the previously read resistance value; the correction factor being inversely proportional to the time elapsed between the application of the previous pulse and the reading, thus making the shape of the following annealing pulse responsive to the elapsed time. The purpose is to account for the so-called recovery time and the initial high speed of resistance drift, both phenomena have explanation in the relevant scientific literature.

The sequence of pulses can be chosen using standard optimization techniques which minimize a cost function based on the statistical model associated with the memory cell. The optimization techniques may include dynamic programming, stochastic dynamic programming, said techniques considering an asymptotic optimization, said techniques considering a finite time horizon. The cost may be probability of not reaching the desired resistance range (failure), the average total energy for programming, the maximum peak current, the average programming power, the average programming time, the average number of programming iterations and possible numerical combinations of said costs. In exemplary embodiments, a finite horizon optimization algorithm known as dynamic programming is used to select an optimal programming strategy to reach a desired resistance range. To this end, the resistance is quantized and the cell quantized resistance is used as a state. The transition from a state to the next one is assumed to be a random function of the applied programming pulse. The random function is described by a transition probability matrix, one matrix for every pulse in the family of pulses. The finite time horizon optimization is defined on a trellis whose number of states is given by the number of quantized resistance values and whose number of sections is equal to the maximum number of programming iterations plus one. The algorithm starts from the last time step and attributing a final cost. It then goes backwards, computing for every stage, for every state, the pulse that minimizes the average cost incurred on the application of the pulse itself, the cost of each outcome being associated with the corresponding state in the next time step. The pulse and the average cost are then stored in correspondence of the state and time step. In exemplary embodiments, the optimization strategy augments the pulse family with a "dummy" pulse whose cost is zero and whose transition matrix is the identity matrix. The role of the "dummy" pulse is to allow possible halt before the time horizon is met. In exemplary embodiments, the strategy to be followed depends on the previous pulses and read resistance values.

In exemplary embodiments, the previous pulses and read resistance values are used to update a statistical model for the cell, for example using a Bayesian estimation of the statistical model starting with an a priori model based on array level observations. At each step the future strategy is then recomputed based on the updated statistical model and using the above described dynamic programming technique. In exemplary embodiments, the optimization algorithm is used to compute the optimal strategy for the application of the annealing pulses and the adjustable reset pulse is chosen to minimize the average cost associated with the annealing pulses strategy. The parameters describing the optimal adjustable reset pulse can be stored in a table, such as table 510 and/or table 610 of FIGS. 5 and 6, that contains one entry for each desired target resistance range. The selection of the optimal pulse and the building of the table can be made repeatedly running the optimization strategy trying for every target resistance range every adjustable reset pulse in a family of pulses, such as variable height pulses with a finite set of possible heights or variable trailing edge slope pulses with a discrete set of possible slopes.

Figure 11:
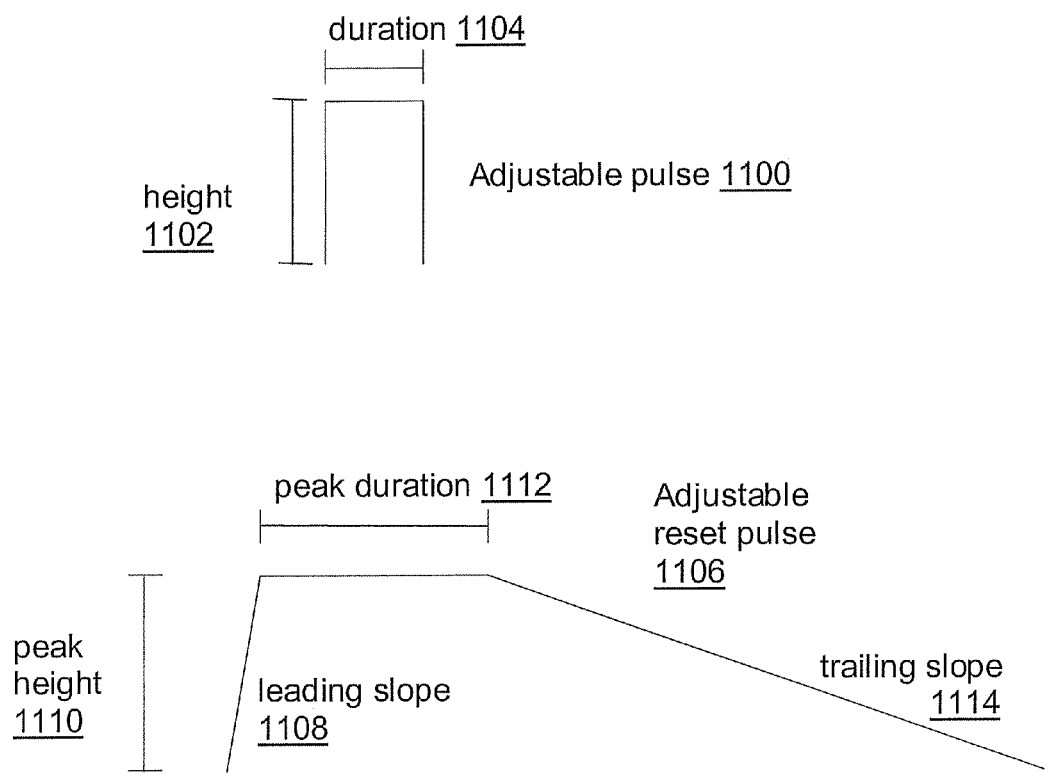
FIG. 11 depicts examples of adjustable pulses including characteristics that can be modified in exemplary embodiments.

FIG. 11 further illustrates exemplary adjustable pulses and parameters or characteristics that can be adjusted in accordance with exemplary embodiments. Adjustable pulse 1100 may represent an adjustable reset pulse or annealing pulse, with a height 1102 and duration 1104 that can be modified as previously described. For example, parameters to modify characteristics of adjustable reset pulse 1106 can be stored in table 510 and/or table 610 of FIGS. 5 and 6. Such parameters can establish a leading slope 1108, peak height 1110, peak duration 1112, and/or trailing slope 1114. Annealing pulses can also be characterized and modified in similar fashion to the adjustable reset pulse 1106 of FIG. 11.

Technical effects and benefits include the ability to improve the probability that a desired value is written to a memory location. Exemplary embodiments select a write signal based on a statistical model that includes known and estimated parameters from previous write results. In this manner, the probability of the desired value being written within a maximum number of iterations is maximized. Further embodiments include improved programming time, power and reliability through selectively applying one or more adjustable reset pulses to melt a PCM cell with coarse resolution followed by a sequence of one or more annealing pulses to fine tune a programmed resistance value for the PCM cell. Reading the current resistance value prior to applying pulses can assist in determining the degree of resetting or annealing likely needed to rapidly converge on a target value in a desired resistance range.

The terminology used herein is for the purpose of describing particular embodiments only and is not intended to be limiting of the invention. As sued herein, the singular forms "a", "an" and "the" are intended to include the plural forms as well, unless the context clearly dictates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to includes any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for programming a phase change memory (PCM) cell, comprising:
  receiving a desired resistance range for the PCM cell, the PCM cell having a state with a resistance value; and
  looping to determine adjustments to the resistance value of the PCM cell, the looping comprising:
    reading the resistance value of the PCM cell;
    applying an annealing pulse in response to determining that the resistance value of the PCM cell is greater than the desired resistance range, the annealing pulse shaped responsive to the resistance value of the PCM cell and the desired resistance range;
    applying an adjustable reset pulse to reset the state of the PCM cell in response to determining that the resistance value of the PCM cell is less than the desired resistance range, the adjustable reset pulse shaped responsive to the desired resistance range by determining an index associated with the desired resistance range and using the index to lookup one or more adjustable reset pulse shape characteristics in a table; and
  repeating the looping until one or more termination criteria are met.

2. The method of claim 1 further comprising:
  applying an initial instance of the adjustable reset pulse prior to the looping.

3. The method of claim 1 wherein the termination criteria comprise:
  the resistance value of the PCM cell being within the desired resistance range; and
  performing a maximum number of looping iterations.

4. The method of claim 1 wherein the adjustable reset pulse is an electrical pulse having a trailing tail with a slope, a leading edge with a slope, a peak height and peak width, and further wherein the adjustable reset pulse is shaped by changing one or more of the slope of the trailing tail, the slope of the leading edge, the peak height and the peak width responsive to the desired resistance range.

5. The method of claim 1 wherein the annealing pulse is shaped further responsive to an elapsed time between a previously applied pulse and the reading of the resistance value of the PCM cell.

6. The method of claim 1 wherein the annealing pulse is selected among a finite collection of available pulses.

7. The method of claim 1 wherein the annealing pulse is shaped responsive to a difference between the resistance value of the PCM cell and the desired resistance range.

8. A method for programming a phase change memory (PCM) cell, comprising:
- receiving a desired resistance range for the PCM cell, the PCM cell having a state with a resistance value; and
- looping to determine adjustments to the resistance value of the PCM cell, the looping comprising;
  - reading the resistance value of the PCM cell;
  - applying an annealing pulse in response to determining that the resistance value of the PCM cell is greater than the desired resistance range, the annealing pulse shaped responsive to the resistance value of the PCM cell and the desired resistance range;
  - applying an adjustable reset pulse to reset the state of the PCM cell in response to determining that the resistance value of the PCM cell is less than the desired resistance range, the adjustable reset pulse shaped responsive to the desired resistance range;
  - assigning a cost to each pulse;
  - determining a statistical model for a probable outcome of applying each pulse as a function of an initial state of the PCM cell;
  - selecting a pulse application sequence for the PCM cell that minimizes a total expected cost until one or more termination criteria are met; and
  - repeating the looping until one or more of the termination criteria are met.

9. The method of claim 8 wherein the cost of each pulse is assigned responsive to at least one of: a duration, a current, and total energy of each pulse.

10. The method of claim 8 wherein selecting the annealing pulse in the pulse application sequence further comprises:
- computing an index for accessing a table as a function of the resistance value of the PCM cell;
- retrieving at least one stored value in the table at the computed index; and
- selecting the annealing pulse responsive to the desired resistance range and the at least one retrieved stored value.

11. The method of claim 8 wherein the statistical model includes one or more unknown parameters, and the method further comprises updating the statistical model using the resistance value of the PCM cell, and a next pulse to apply is chosen to minimize the total expected cost according to the updated statistical model until one or more of the termination criteria are met.

12. A method for programming a phase change memory (PCM) cell, comprising:
- receiving a desired resistance range for the PCM cell, the PCM cell having a state with a resistance value; and
- looping to determine adjustments to the resistance value of the PCM cell, the looping comprising:
  - reading the resistance value of the PCM cell;
  - applying an annealing pulse in response to determining that the resistance value of the PCM cell is greater than the desired resistance range, the annealing pulse shaped responsive to the resistance value of the PCM cell and the desired resistance range, wherein the annealing pulse is shaped further responsive to an elapsed time between a previously applied pulse and the reading of the resistance value of the PCM cell by applying a correction factor to the resistance value, where the correction factor is inversely proportional to the elapsed time;
  - applying an adjustable reset pulse to reset the state of the PCM cell in response to determining that the resistance value of the PCM cell is less than the desired resistance range, the adjustable reset pulse shaped responsive to the desired resistance range; and
- repeating the looping until one or more termination criteria are met.

* * * * *